United States Patent [19]
Minami

[11] Patent Number: 5,359,300
[45] Date of Patent: Oct. 25, 1994

[54] PHASE LOCKED LOOP (PLL) HAVING A POWER SUPPLY CIRCUIT

[75] Inventor: Yoichiro Minami, Tokyo, Japan

[73] Assignee: NEC Corporation, Japan

[21] Appl. No.: 82,245

[22] Filed: Jun. 24, 1993

[30] Foreign Application Priority Data

Jun. 26, 1992 [JP] Japan .................. 4-168120

[51] Int. Cl.[5] .................. H03L 7/06; H03L 7/085; H03L 7/089; H03L 7/093
[52] U.S. Cl. .................. 331/17; 331/8; 331/18; 331/25; 331/62; 331/186

[58] Field of Search .................. 331/8, 16, 17, 18, 25, 331/62, 185, 186

[56] References Cited

U.S. PATENT DOCUMENTS 4,598,258  7/1986  Babano .................. 331/185 X

Primary Examiner—David Mis
Attorney, Agent, or Firm—Laff, Whitesel, Conte & Saret

[57] ABSTRACT

A phase locked loop PLL circuitry for use in a radio pager. A power source applies a voltage to a charge pump circuit. A power supply control circuit controls the application of the voltage.

6 Claims, 3 Drawing Sheets

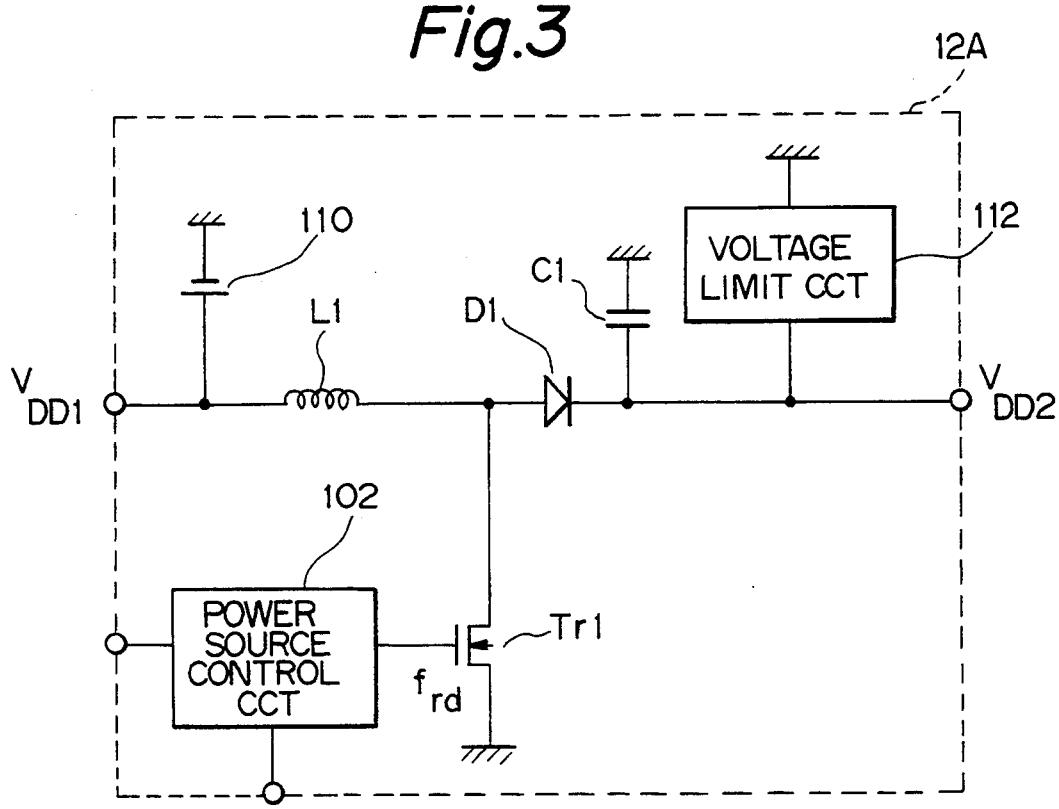
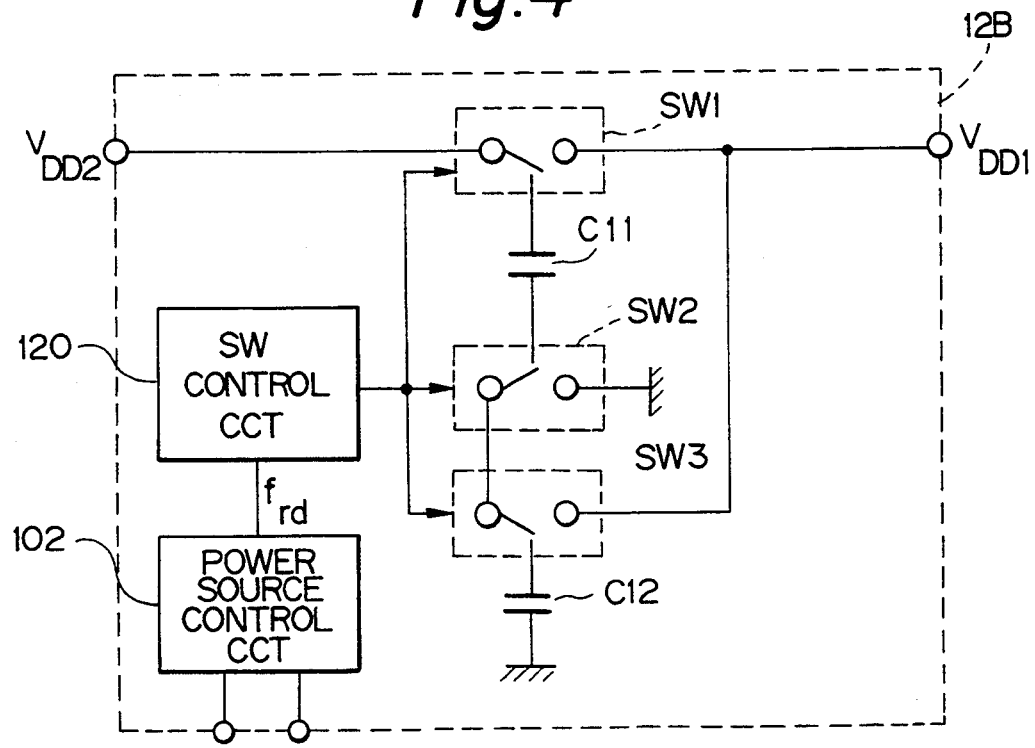

PHASE LOCKED LOOP (PLL) HAVING A POWER SUPPLY CIRCUIT

BACKGROUND OF THE INVENTION

The present invention relates to PLL (Phase Locked Loop) circuit for use in a radio pager and, more particularly, to a power supply for a PLL circuitry.

A PLL circuit for the above application has customarily been made up of a PLL section including a charge pump circuit, and a power supply section. For miniaturization, the PLL circuit is as constructed as to operate at low voltage and consume great current. However, a higher voltage, e.g., 3 volts has to be applied to the charge pump circuit than to the other circuits in order to enhance the carrier-to-noise (C/N) ratio of oscillation frequency signal. For this purpose, the power supply section is provided with a DC/DC converter. The DC/DC converter, however, undesirably scales up the overall PLL circuit and, therefore, obstructs the miniaturization of a radio pager.

SUMMARY OF THE INVENTION

It is therefore an object of the present invention to provide miniature PLL circuit.

It is another object of the present invention to provide a miniature radio pager.

PLL circuit of the present invention comprises a variable frequency signal dividing circuit for variably dividing an oscillation frequency signal to produce a variable divided frequency signal, a reference frequency signal dividing circuit for producing a first and a second reference divided frequency signal in response to a reference frequency signal, a phase comparing circuit for comparing the variable divided frequency signal with the first reference divided frequency signal, a charge pump circuit for receiving an output of the phase comparing circuit, and a power supply for applying a voltage to each of the circuits. The power supply comprises a battery, a booster for boosting an output voltage of the battery to produce a boosted voltage for the charge pump circuit, a switching circuit for controlling the booster, and a power supply control circuit for controlling, when the variable divided frequency signal is advanced in phase relative to the first reference divided frequency signal, the switching circuit by the second reference divided frequency signal only for a period of time during which the phase comparing circuit outputs a control signal.

BRIEF DESCRIPTION OF THE DRAWINGS

The above and other objects, features and advantages of the present invention will become more apparent from the following detailed description taken with the accompanying drawings in which:

FIGS. 3 and 4 are schematic block diagrams each showing a specific modification of the embodiment.

DESCRIPTION OF THE PREFERRED EMBODIMENT

Figure 1:
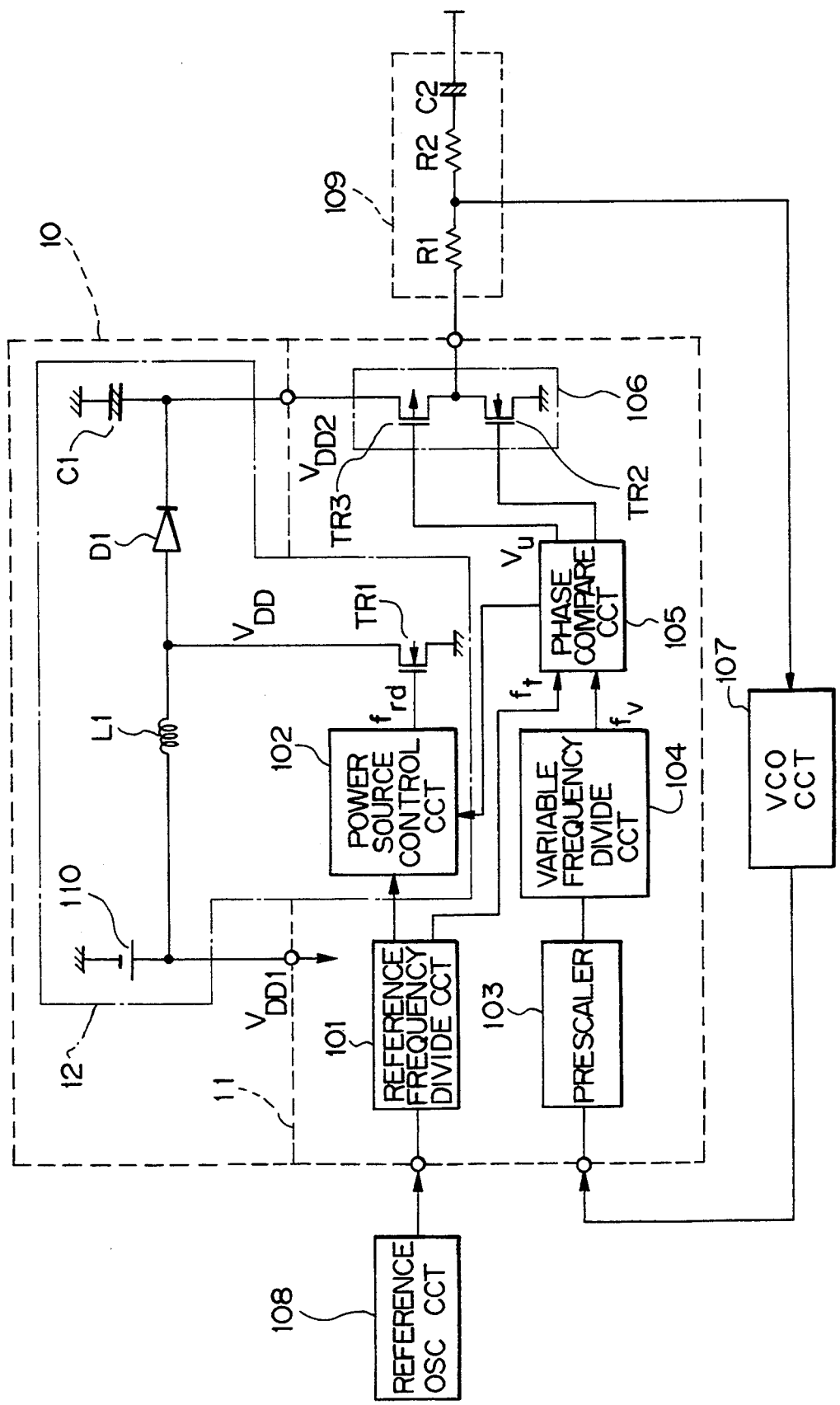
FIG. 1 is a block diagram schematically showing a preferred embodiment of the PLL circuit in accordance with the present invention.
Figure 2:
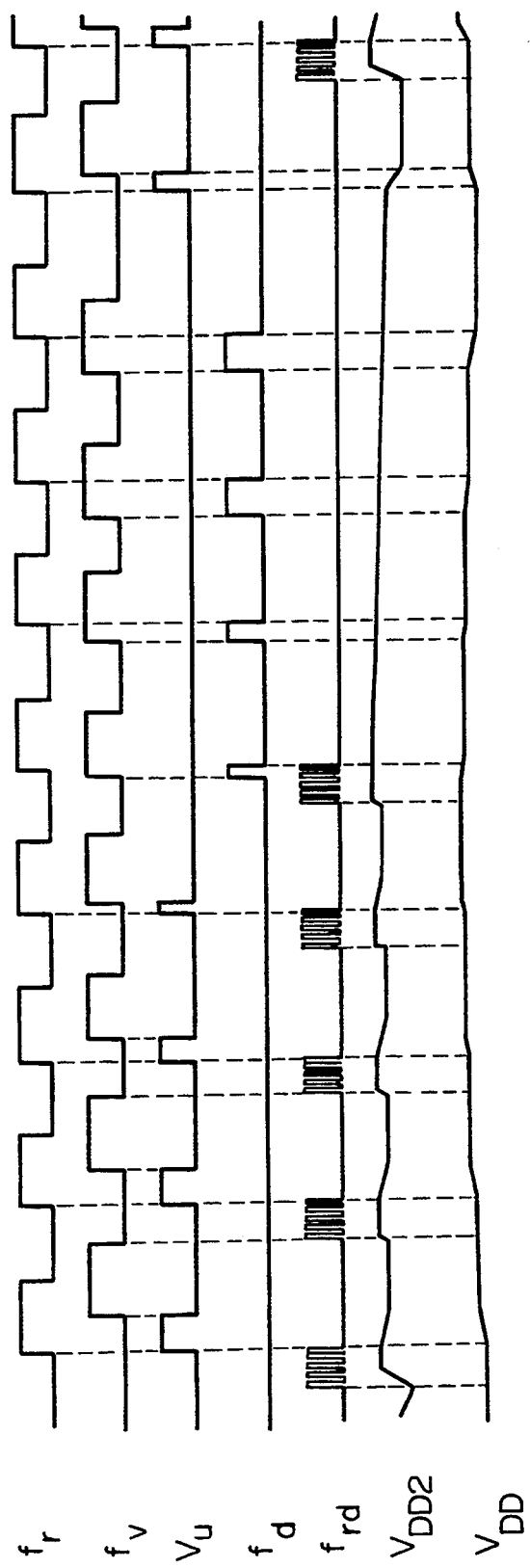
FIG. 2 show specific waveforms of input signals to a charge pump circuit included in the embodiment.

Referring to FIG. 1, the PLL circuit embodying the present invention is shown and includes a charge pump circuit 106. FIG. 2 shows specific waveforms of input signals to the charge pump circuit 106. As shown in FIG. 1, the PLL circuit, generally 10, has a PLL section 11 and a power supply section 12.

The PLL section 11 is made up of a prescaler 103, a variable frequency signal dividing circuit 104, a reference frequency signal dividing circuit 101, a phase comparing circuit 105, and the charge pump circuit 106. The variable frequency signal dividing circuit 104 divides the oscillation frequency signal of a voltage controlled oscillator (VCO) circuit 107 via the prescaler 103 to output a variable divided frequency signal fv. The reference frequency signal dividing circuit 101 receives a reference frequency signal signal from a reference oscillation circuit 108 and outputs a first reference divided frequency signal fr. The phase comparing circuit 105 compares the output frequencies signals fv and fr of the frequency signal dividing circuits 104 and 101, respectively. On receiving the output of the phase comparing circuit 105, the charge pump circuit 106 delivers the resulting output thereof to a loop filter 109.

The power supply section 12 has a battery 110 for applying a voltage to the constituent circuits of the PLL section 11. A booster coil L1, a diode D1 and a capacitor C1 cooperate to boost the output voltage of the battery 110 and deliver the boosted voltage to the charge pump circuit 106. A power supply control circuit 102 controls the booster coil L1 via a switching transistor TR1.

The charge pump circuit 106 is implemented by an n-channel transistor TR2 and a p-channel transistor TR3. Each of the transistors TR2 and TR3 has a gate controlled by one of two control signals from the phase comparing circuit 105. The loop filter 109 is constituted by resistors R1 and R2, and a capacitor C2.

In operation, the variable frequency signal dividing circuit 104 divides the oscillation frequency signal of the VCO circuit 107 while the reference frequency signal dividing circuit 101 divides the oscillation frequency signal of the reference oscillator circuit 108. The phase comparing circuit 105 compares the phases of the output signals fv and fr of the oscillation circuits 107 and 108 and delivers the resulting error signal to the loop filter 109 via the charge pump circuit 106. As a result, the loop filter 109 produces an error voltage matching the input error signal. The error voltage is applied to the VCO circuit 107 to control the oscillation frequency signal thereof. The output of the VCO circuit 107 is fed to the PLL circuit 10 to maintain the error signal constant. The variable frequency signal dividing circuit 104 and reference frequency signal dividing circuit 101 are each capable of changing the division ratio in response to a frequency signal select signal from a control circuit, not shown. Hence, the output frequency signal of the VCO circuit 107 matches the frequency signal select signal at all times.

The operation of the power supply circuit 12 will be described with reference to FIGS. 1 and 2. The switching transistor TR1 is switched by a frequency signal frd to, in turn, switch the booster coil L1. The diode D1 captures the resulting counter electromotive force of the booster coil L1 and stores it in the capacitor C1. It is to be noted that a feedback circuit for lowering the voltage is not shown for simplicity. Only when the p-channel transistor TR3 is turned on, the power supply current flows into the charge pump circuit 106. As a result, assuming that the PLL section 11 tunes the frequency signal, a load acts on the power supply section 12 when the output frequency signal of the VCO circuit 107 is lower than a predetermined frequency signal. By using this fact, the power supply control circuit 102 executes the control shown in FIG. 2.

Specifically, when the variable divided frequency signal fv is retarded in phase relative to the reference divided frequency signal fr, the UP output Vu and DOWN output Vd of the phase comparing circuit 105 become ON and OFF, respectively. Conversely, when the frequency signal fv is advanced relative to the frequency signal fr, the UP output Vu and DOWN output Vd become OFF and ON, respectively. As the UP output becomes ON, the power supply control circuit 102 opens the gate for a predetermined period of time, i.e., up to the next positive-going edge of the frequency signal fr with the output frequency signal frd thereof, thereby maintaining the power supply section 12 operative. During this period of time, no load current flows into the power supply section 12 since the charge pump circuit 106 is turned off, whereby the charge is stored in the capacitor C1. Subsequently, as the UP output Vu becomes ON, the power supply to the charge pump circuit 106 is insured. When the frequency signal fv is retarded relative to the reference frequency signal fr, the n-channel transistor TR2 of the charge pump circuit 106 is turned on to prevent a load from acting on the power supply section 12 and, therefore, prevent the frequency signal frd from acting.

FIG. 3 shows a modified form of the power supply section 12, FIG. 1. It is likely with the power supply section 12 of FIG. 1 that the boosted voltage is brought out of control and becomes high. Although such an occurrence does not matter as far as the operation of the PLL circuit is concerned, it produces noise which is critical when it comes to a radio pager. In the light of this, a modified power supply circuit 12A shown in FIG. 3 has a voltage limiting circuit 112 for limiting the maximum output voltage. If desired, the voltage limiting circuit 112 may be implemented by a Zener diode.

FIG. 4 shows another modification of the power supply section 12. As shown, the power supply circuit 12B is made up of switches SW1, SW2 and SW3, a switch (SW) control circuit 120, the power supply control circuit 102, and boosting capacitors C11 and C12. In response to the output signal frd of the power supply control circuit 102, the power supply section 12 doubles the voltage. Specifically, the SW control circuit 120 generates a control signal in response to the output signal frd of the power supply control circuit 102 so as to operate the switches SW1, SW2 and SW3. As a result, the connection of the capacitor C11 and that of the capacitor C12 are switched over. By using the doubled voltage $V_{DD1}$ as a voltage $V_{DD2}$, the power supply section 12B achieves the same advantages as the power supply section 12 of FIG. 1. Another advantage achievable with the power supply section 12B is that the circuit is scaled down since the coil is replaced with capacitors.

In summary, it will be seen that the present invention provides PLL circuit which is far smaller in size than conventional one.

Various modifications will become possible for those skilled in the art after receiving the teachings of the present disclosure without departing from the scope thereof.

What is claimed is:

1. A phase locked loop (PLL) circuit comprising:
   a variable frequency signal dividing circuit for variably dividing an oscillation frequency signal to produce a variable divided frequency;
   a reference frequency dividing circuit for producing a first reference divided frequency signal and a second reference divided frequency signal in response to a reference frequency signal;
   a phase comparing circuit for comparing said variable divided frequency signal with said first reference divided frequency signal;
   a charge pump circuit coupled to receive an output of said phase comparing circuit; and
   a power supply means coupled to apply a voltage to each of said circuits;
   said power supply means comprising: a battery, boosting means for boosting an output voltage of said battery to produce a boosted voltage for application to said charge pump circuit means, a switching circuit means for controlling said boosting means, and a power supply control circuit means responsive to said variable divided frequency signal being advanced in phase relative to the phase of said first reference divided frequency signal for controlling said switching circuit means by said second reference divided frequency signal for only a period of time during which said phase comparing circuit outputs a control signal.

2. A PLL circuit as claimed in claim 1, wherein said variable divided frequency signal is advanced in phase relative to the phase of said first reference divided frequency signal, said phase comparing circuit means outputs said control signal responsive to said phase advance for a period of time up to the next positive-going edge of said first reference divided frequency signal.

3. A PLL circuitry as claimed in claim 1, wherein said switching circuit means comprises a transistor.

4. A PLL circuitry as claimed in claim 1, wherein said boosting means comprises a booster coil, a diode, and a capacitor.

5. A PLL circuitry as claimed in claim 4, wherein said boosting means further comprising a voltage limiting means for limiting a maximum output voltage.

6. A PLL circuitry as claimed in claim 1, wherein said boosting means comprises a boosting capacitor and switches.

* * * * *